United States Patent [19]
Miller

[11] Patent Number: 4,745,357
[45] Date of Patent: May 17, 1988

[54] OPTICAL INTERFACE FOR A MAGNETO-OPTICAL CURRENT TRANSDUCER

[75] Inventor: Robert C. Miller, Salem Twp., Westmoreland County, Pa.

[73] Assignee: Westinghouse Electric Corp., Pittsburgh, Pa.

[21] Appl. No.: 30,004

[22] Filed: Mar. 23, 1987

[51] Int. Cl.⁴ .......................... G02B 6/42; G02F 1/09
[52] U.S. Cl. ................................. 324/96; 350/96.15; 350/375
[58] Field of Search ............... 324/96; 350/96.2, 374, 350/375, 376, 377, 379, 385, 96.18, 96.19, 96.15; 356/364, 365, 366, 368

[56] References Cited
U.S. PATENT DOCUMENTS

| | | | |
|---|---|---|---|
| 4,329,017 | 5/1982 | Kapany et al. | 350/96.19 X |
| 4,564,754 | 1/1986 | Sato et al. | 350/375 X |
| 4,699,453 | 10/1987 | Roberts | 350/96.18 X |
| 4,703,472 | 10/1987 | Blumentritt et al. | 350/96.19 X |

Primary Examiner—Reinhard J. Eisenzopf
Assistant Examiner—Stephen M. Baker
Attorney, Agent, or Firm—G. Hawranko

[57] ABSTRACT

A magneto-optical current measuring device includes a collimating lens arrangement for focusing a light signal into a parallel beam of light, which beam of light, when polarized is communicated through a Faraday rotator which is disposed in surrounding proximity to the transmission line in which it is desired to measure the current flow. The collimating lens element is formed of a segment of a parabolic lens and a spacer lens element which has a flat surface formed by an edge opposite the parabolic surface, this flat surface extending to the focal length of the parabolic surface. The collimating lens element is constructed in the manner of a monolithic configuration and is then secured together with the polarizing element to the Faraday rotator in a manner so as to eliminate all air-to-glass interfaces.

6 Claims, 3 Drawing Sheets

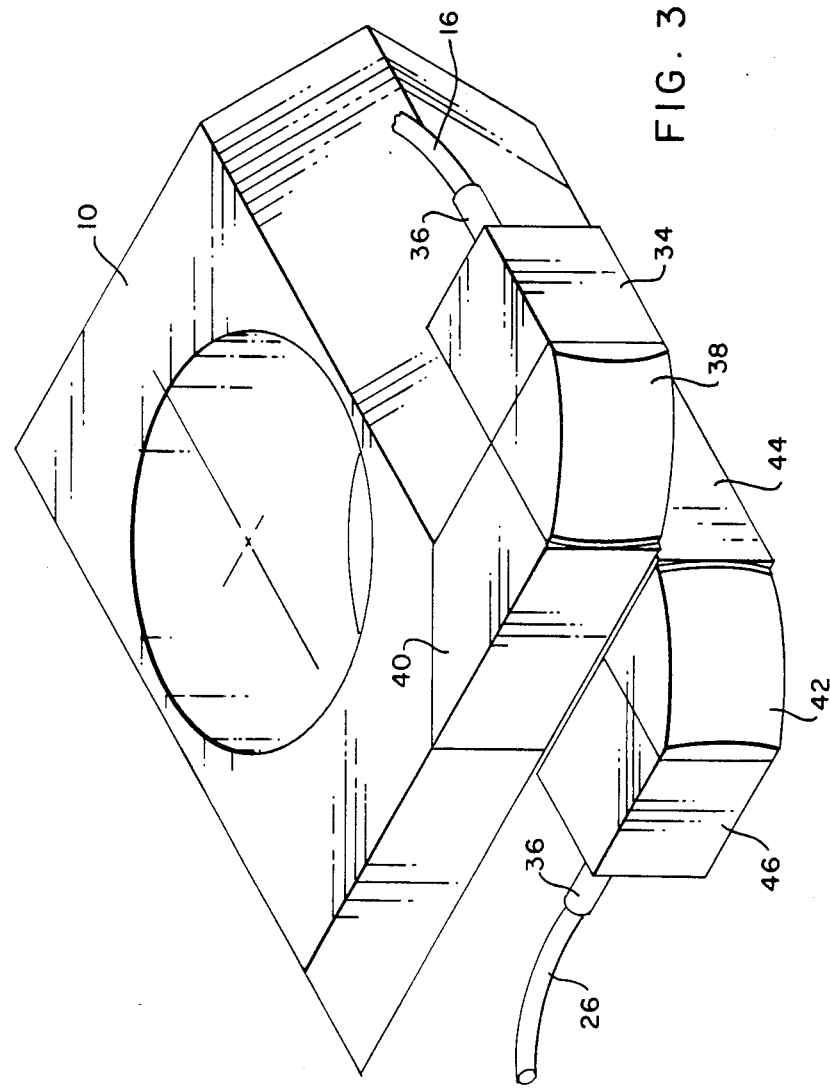

OPTICAL INTERFACE FOR A MAGNETO-OPTICAL CURRENT TRANSDUCER

FIELD OF THE INVENTION

This invention relates to a device for efficiently communicating an optical signal between an optic cable and a light operative device on which the optical signal is intended to operate. More particularly, this invention relates to a device for interfacing a light beam between a fiber optic cable and a Faraday rotator which is utilized in energy metering systems having a magneto-optical current transformer for sensing current in a energy transmission line.

BACKGROUND OF THE INVENTION

An AC electric metering system planned for extensive future use by electric utility companies, employs magneto-optical current transformers, hereinafter called MOCTs, for sensing current in extra high voltage transmission lines. Such MOCTs have been found to offer certain advantages over conventional current transformers that utilize copper and iron designs. For instance, the MOCT enjoys total electric isolation and therefore does not require the additional costly insulating techniques that a conventional current transformer requires. Additionally, the MOCT enjoys immunity to electro-magnetic radiation that is not similarly enjoyed by conventional current transformers. For these reasons and various other reasons known to those skilled in this technology, the MOCT is being contemplated for more widespread usage in the electrical utility industry. An example of an AC electric metering system employing an MOCT is found in U.S. Pat. No. 4,578,639 which issued on Mar. 26, 1986 to Robert C. Miller. Various other developments relating to this technology have occured recently, an example of which is U.S. Pat. No. 4,540,937 which issued to Juris A. Asars on June 7, 1983 wherein it is disclosed that an electronic circuit compensates for the DC component of a substantially AC output signal when a magneto-optical current sensor using the Faraday effect is utilized.

One of the key elements making the use of MOCTs favorable, is the Faraday rotator which employs the principal of the Faraday effect. It is known that the Faraday effect establishes that when a plane polarized beam of light passes through a certain transparent substance having known optical characteristics, the plane of the polarized light emitted from the transparent substance is different than that which entered; this change in planar orientation being determined as a function of the magnetic field by which the transparent substance is disposed. It is known that by measuring the change in the planar orientation, the magnitude of the current flowing in the transmission line which passes through the Faraday rotator can be determined.

The Faraday rotator type optical sensor can also be used in other applications for which it is desired to sense current flow through a load. Besides the application for MOCTs, the Faraday rotator has been used in electric motor and transformer arrangement to detect an overload current condition in a high voltage electrical load and to transmit this information to a low voltage processing circuit which provides desired isolation between the high voltage load and the low voltage processing circuit. This application of a Faraday rotator can be seen in U.S. Pat. No. 4,363,061 issued on Dec. 7, 1982 to Eugene G. Vaerewyck et al.

In applying the Faraday rotator to an AC metering situation, it is required that the method by which the beam of light is introduced to the transparent substance contribute as little attenuation of the optical signal as possible. It is further required that this interfacing arrangement not introduce additional signal losses for other reasons such as because of spherical aberrations or surface contamination. Examples of the current method of connecting the fiber optic cable to a Faraday rotator can be found in the previously referenced U.S. Pat. No. 4,578,639 as well as Japanese Patent No. 58-153174 which issued on Sept. 12, 1983 to Tadashi Satou. These references illustrate a typical collimator/lens arrangement for connecting each of the input and output optical cables to the Faraday rotator. In these arrangements, a simple lens is used to collect the light emanating from the end of the input fiber optic cable, and a collimator element then collimates this light into a bundle of parallel light which passes through the Faraday rotator. Associated with this technique is a total of eight glass-to-air interfaces which, unless the surfaces are coated, results in reflection loss of approximately 0.17 db per interface for a total attenuation of approximately 1.4 db. It is understood that these eight interfaces are easily contaminated with dirt or condensed moisture causing additional, possibly large, increases in attenuation. Additionally, because existing interface arrangements utilize a spherically shaped lens, it has been found that several additional dbs attenuation is introduced due to spherical aberration.

Further detrimental to the use of a spherical lens is the inherent disadvantage that a spherical lens is not achromatic; that is, the spherical lens will work at only one wave length. One can understand the severity of this characteristic when one tries to assemble and install such a collimator/lens arrangement for system use. On assembling this lens arrangement, it is ultimately desired to receive at the output fiber optic cable as large a signal as possible relative to the magnitude of the optic signal injected into the input fiber optic cable. To verify that this in fact occurs, a signal in the infrared wavelength must be used since this is the signal under which the device will operate. As such, in order to set up the Faraday rotator using this type of collimator/lens arrangement, special testing and tooling is required to verify the level of the infrared signal input and the magnitude of the infrared signal output from the respective fiber optic cables.

Examples of prior art patents which also disclose this type of collimator/lens arrangement for application in AC metering systems are U.S. Pat. No. 4,428,017 issued on Jan. 24, 1984 to Eugene G. Vaerewyck et al. and U.S. Pat. No. 4,612,500 issued to Chen et al. on Sept. 16, 1986.

Further examples of U.S. patents disclosing alternate arrangements for communicating optical signals and connecting fiber optic cables are U.S. Pat. No. 4,445,751 issued on May 1, 1984 to William C. Divens et al., U.S. Pat. No. 4,474,429 issued on Oct. 2, 1984 to Bulent E. Yoldas et al. and U.S. Pat. No. 4,613,811 issued on Sept. 23, 1986 to Eugene G. Vaerewyck et al. The reference U.S. Pat. No. 4,445,751 provides an interferometer system which uses titanium to form an optical waveguide; reference U.S. Pat. No. 4,474,429 provides an ion-polished optical cable coated with a liquid that contains glass constituents that can be fused to form an optical connection; and reference U.S. Pat. No. 4,613,811 provides an optical cable disposed between two components--one of which compensates for temperature, loop degradation, and linearity.

SUMMARY OF THE INVENTION

It is therefore an object of the invention to provide an optical interface device for efficiently communicating an optical signal between a fiber optic cable and a Faraday rotator or similar type light operative device, with a minimum amount of signal attenuation and wherein the optical interface device is relatively simple and easy to install and set up.

In accordance with the principles of the present invention, there is provided an optical interface device for communicating an optical signal between a fiber optic cable and a light operative device which comprises a means of collimating the small divergent bundle of light which makes up the optical signal into a parallel beam of light having a fixed diameter determined as a function of a focal length associated with the collimating means, a means for polarizing the parallel beam of light, and wherein the collimating means and polarizing means are connected to the light operative device in a continuous manner.

BRIEF DESCRIPTION OF THE DRAWINGS

FIG. 3 is an orthogonal view of a Faraday rotator having connected thereto collimator lens elements constructed in accordance with the present invention.

DESCRIPTION AND OPERATION

Figure 1:
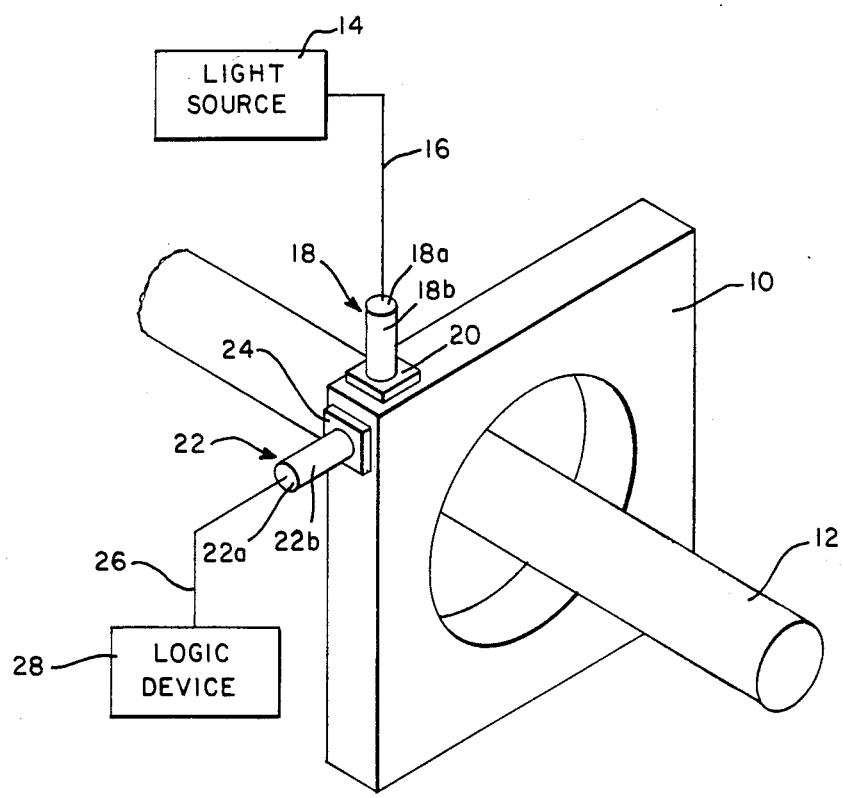
FIG. 1 is an elevational view in section of a Faraday rotator and collimator/lens arrangement constructed in accordance with the prior art teachings.

As seen in FIG. 1, a Faraday rotator 10 is disposed in surrounding proximity to an energy transmission line 12 so that the Faraday effect can be utilized to sense the current in the transmission line 12 a light source 14 provides the optical signal which is transmitted over an input fiber optic cable 16 to an input collimating lens element 18. The input collimating lens element 18 includes a lens portion 18a connected to the fiber optic cable 16 and a collimating portion 18b connected to the lens portion 18a. The input collimating lens element 18 is connected to a polarizing element 20 which is then connected to an edge of the Faraday rotator 10. Connected to an adjacent edge of the Faraday rotator 10 is an output collimating lens element 22 and polarizing element 24 which are configured in an identical manner as the input arrangement. An output fiber optic cable 26 is connected to the output collimating lens element 22 and communicates the optic signal output therefrom, which has been altered by passage through the Faraday rotator 10 as a function of the magnitude of the current in the energy transmission line 12, to a logic device 28. The logic device 28 is effective for determining this current magnitude form the altered optical signal according to known techniques.

It can be seen by the construction of both the input and output collimating lens elements 18 and 22 that, according to the prior art, there are four air-to-glass interfaces for each lens element thereby resulting in a total of eight air-to-glass interfaces encountered by the input optical signal in traversing from the light source 14 to the logic device 28. It is known that for each of these air-to-glass interfaces, a signal attenuation of approximately 0.17 db is introduced, so that for eight of such interfaces, a total signal attenuation of approximately 1.4 db is introduced. Additionally it is understood that by the provision of this many interfaces, the risk of dirt contamination or moisture condensation which further aggravate the attenuation problem, is greatly increased.

As previously noted, the shape of the collimating portion 18b which is spherical, incurs problems in two areas, the first of which is an added signal attenuation due to a spherical aberration associated with the shape, and second of which is the inherent limitation that a spherical optic device is only responsive to the one specific light wavelength for which it is selected. The disadvantages associated with this limitation can best be illustrated by way of the following example wherein the Faraday rotator 10 will be calibrated for system operation.

Since the Faraday rotator 10 will operate using a light beam in the infrared wavelength, the positioning of the collimating lens elements 18 and 22 to achieve the maximum output signal relative to the level of the input signal, must be accomplished using that same infrared signal. Accordingly, the input assembly which includes the collimating lens element 18 and the polarizer 20 is attached to the Faraday rotator 10 and an infrared signal is input thereby. It is then necessary to place the output assembly which consists of collimating lens element 22 and the polarizer 24 at the position on the edge of the Faraday rotator 10 where the infrared signal is at its peak value. However, since the infrared signal is not visible to the human eye, special infrared sensing equipment must be used as tools in this positioning; such equipment as will have to be used in a coordinated manner so as to not block the placement of the output assembly. It will be recognized that the coordination of the placement of the input and output assemblies may require a number of trial and error type adjustments to achieve an acceptable result; an exercise which is both time consuming and expensive.

Figure 2A:
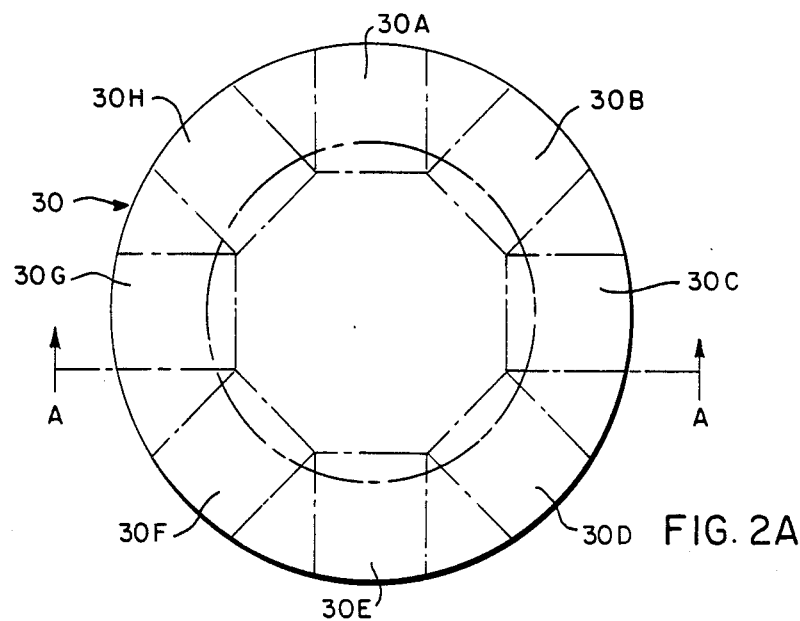
FIG. 2A is an elevational view is section of the optical element from which is constructed the collimating lens element of the present invention.
Figure 2B:
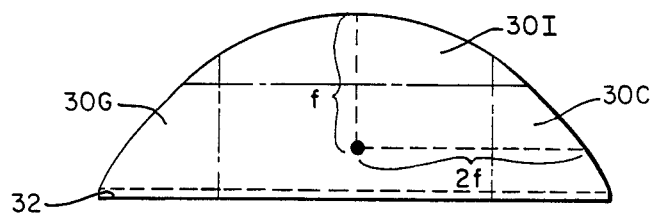
FIG. 2B is a side view in section of the optical element of FIG. 2A, taken along line A—A of FIG. 1.

As seen in FIGS. 2A and 2B, an aspherical collimating lens arrangement is provided from an optical material configured in the form of a paraboloid of revolution designated as reference numeral 30. Since the focal point of the paraboloid of revolution 30 falls within the optical material, it can be appreciated that it would be impossible to use the entire parabolic element 30 for each collimating lens element. Therefore, a segment of the parabolic element 30 would offer the same beneficial characteristics as the larger device in a more manageable dimension and at a more reasonable cost. For these reasons, the parabolic element 30 is shown in FIG. 2A as divided into eight identical segments designated 30a through 30h. FIG. 2B shows the relationship of the actual focal point F for the paraboloid of revolution 30 the the effective focal length Zf when one of the segments 30C of the paraboloid of revolution 30 is used. When one considers that various sizes for the paraboloid of revolution 30 are possible which would thus yield a variety of possible focal lengths Zf for the parabolic segments 30A-30H, it can also be appreciated that the number of segments derived from the parabolic element 30 is chosen to be eight only for purposes of illustration and that any number of segments can be chosen and still remain within the scope of this invention.

As known to those skilled in the field of optics, one of the beneficial characteristics of the parabolic optical device is the fact that it is achromatic; that is, it is equally responsive to light at any wavelength. This is in contrast to the characteristic prior art collimating lens arrangement which is not achromatic; the distinction for which will be presented hereinafter in further detail. An additional beneficial characteristic of the parabolic optical device is that a parallel stream of light can be derived therefrom. This parallel beam of light has associated therewith, a specific diameter which is determined approximately as a function of the product of the focal length of the parabolic element and the sine of the angle of the divergent light as it is introduced to the parabolic element. It is also known that this sine value can be expressed as the numerical aperture (NA) of the medium by which the divergent light is communicated to the parabolic element, divided by the index of refraction of the parabolic element (n).

Figure 2C:
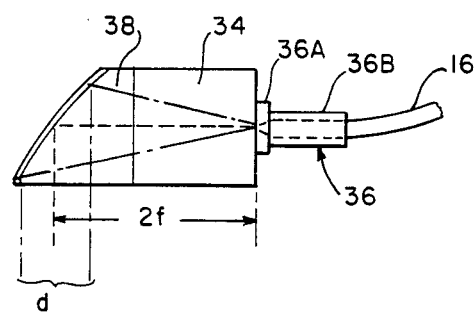
FIG. 2C is an elevational view in section of the collimator lens element constructed in accordance with the present invention.

This relationship can best be illustrated by way of an example using the dimensions of the parabolic element as shown in FIGS. 2A through 2C. However, it must be realized that these numbers are examples only and that other dimensions would satisfy the requirements of this invention. It must also be realized that the diameter of the parallel stream of light emerging from the collimating lens element 38 or 42 is controlled by the dimension of the Faraday rotator 10. This diameter should be chosen to be safely within the cross-sectional area of the Faraday rotator 10 through which the light signal is directed; for example, where the cross-sectional area is 0.75 inches, the diameter of the light signal should be no more than 0.625 inches. It will first be noted that the fiber optic cable 16 which introduces the light signal to the parabolic element 30 has a numerical aperture of 0.3 and additionally that the parabolic element 30 which in this embodiment is a fused silica material, has an index of refraction of 1.463 so that the sine value becomes approximately 0.2. Knowing that the diameter, which is selected as 0.625 inches, is approximately equal to twice the focal length (Zf) times the sine value previously calculated as 0.2, it can be determined that the focal length should be approximately 1.50 inches. It is understood that in entering a less dense optical medium, the problem of the critical angle of that material must be addressed; otherwise, if that angle is exceeded, refraction of the light signal will result. This problem can be avoided by selection of an optical material having an index of refraction that allows for remaining below the critical angle for the particular application; or, it can also be avoided by silver-coating the parabolic surface, thereby eliminating refraction of the light signal and providing that the parabolic surface will reflect the light signal for all angles of incidence.

Each of the parabolic segments, only one of which is shown in FIG. 2, is obtained by first cutting off the center of the parabolic element 30 shown as the topmost portion 30I in FIG. 2B and then cutting along the segment lines shown in FIG. 2A. In performing this manufacturing operation, it was found that in order to maintain the proper axial reference for the center of the parabolic element 30 after the center portion had been removed, a reference ring 32, formed along the outer periphery of the parabolic element 30, was necessary to provide a reference point for establishing the center axis of each of the segments.

As seen in FIG. 2C, in order for each of the collimating lens elements 38 or 42 to achieve the previously derived dimension for the optimum focal length, a spacer element 34 is secured to the flat surface of the parabolic segment 38 formed opposite the parabolic surface. The spacer element 34 is constructed of the same fused silica material as the parabolic segment 38 and is of the dimension necessary to have its edge opposite that edge connected to the parabolic segment 38, extend to the optimum focal length. As seen in FIG. 2C, this edge of the spacer 34 is the point at which the input fiber optic cable 16 is attached to the collimating lens element 38.

The end of the fiber optic cable 16 that is to be attached to the collimating lens element 18 has secured thereto, an optic connector 36 which has a widened base portion 36A and a tapered receptor portion 36B. The tapered receptor portion 36B is effective for centering the light signal as it enters the collimating lens element 18. The base portion 36A can be secured to the spacer edge by means of a UV curing cement which, as known to those skilled in the art, does not set until a UV light is introduced thereby allowing the manipulation of the optic connector 36 to the optimum position on the spacer edge.

As previously stated, the prior art collimator/lens arrangements suffered in the manner in which the initial set up had to be performed wherein the non-achromatic characteristics of the spherical arrangement proved to be detrimental. In the setup procedure of the present invention, a visible light is initially used such that the need for special tooling and set up equipment is avoided. Once the optimum placement of the input and output collimating lens elements 38 and 42 has been determined by visually citing the point at which the visual light signal output is at its maximum value relative to the level of the visual light signal input thereto, the UV curing cement can again be utilized to set these positions permanently. The infrared light signal which will serve as the means for determining the current magnitude in the energy transmission line 12 can then be passed through the Faraday rotator 10. In this manner, it can be seen that the achromatic characteristics of the parabolic element 30 can be utilized in the visual wavelength, the ultraviolet wavelength and the infrared wavelength.

Further advantageous in the use of the parabolic element 30 formed on the fused silica material, which is readily, commerically available from Corning Corporation and has a product designation of fused silica No. 7940 with occlusion and homogeneity qualities determined on the basis of an industry standard grade of material rating, is that the surfaces of the Faraday rotator 10 can also be silver-coated to eliminate the possibility of surface contamination or moisture condensation. Additionally, by securing these elements together to achieve essentially a monolithic construction, the problems of thermal expansion that could otherwise occur and contribute to the attenuation of the light signal, are avoided.

As illustrated in FIG. 2C, the collimating lens element 38 or 42 receives the light signal which is shown as a dashed line at the narrow point or the optic connector 36 secures to the spacer element 34. At this point, the light signal spreads out into the divergent beam of light characterized by the angle for which the sine value was previously determined using the numerical aperture value and the index of refraction value. The focusing quality of the collimating lens element 38 or 42 which yields the parallel beam of light for which the diameter was previously determined, is a result of what can be characterized as an off axis type of parabolic configuration; that is, this focusing occurs away from the center axis of the parabolic element 30. Though the off axis configuration is familiar in the art, the use of this configuration with a light signal internal to the parabolic element 30 is not commonly found.

As seen in FIG. 3A, the application of the collimating lens elements 38 and 42 is illustrated wherein the input collimating lens element 38 is secured to an upper segment of one edge of the Faraday rotator 10 over a polarizing element 40 and the output collimating lens element 42 and spacer element 46 configuration are secured to a lower segment on an adjacent edge of the Faraday rotator 10 over another polarizing element 44.

It should be noted that the Faraday rotator 10 used in this application consists of essentially symmetric upper and lower segments 10a and 10b which are each sloped on opposing sides, and when configured in the final form, provide alternating upper and lower sloped edges adjacent to one another. The polarizing elements 40 and 44 are sloped according to this contour of the Faraday rotator 10 and additionally, for purposes of achieving the necessary polarization.

The opposite faces of the two polarizing elements 40 and 44 are flat surfaces so that the input and output collimating lens elements 38 and 42 can be secured thereon in a manner so that the light signal can be directed by the parabolic surfaces in a direction 90° opposite to the direction that its enters either of the collimating lens elements 38 or 42. It can be appreciated that by this configuration, the collimating lens elements 38 and 42 are disposed in parallel manner relative to the edge of the Faraday rotator 10 on which they are secured. Prior art configurations in contrast are secured in a perpendicular manner relative to the edge of the Faraday rotator 10 on which they are secured. This prior art configuration suffers in two areas; namely, it requires additional space because of the extending nature of this connection and secondly, this configuration is more prone to accidental damage.

The operation of the Faraday rotator 10 utilizing the collimating lens elements of the present invention is essentially the same as that of the prior art. The Faraday rotator 10 is disposed in surrounding proximity to the energy transmission line 12 for which it is desired to measure the current flow. A light signal in the infrared wavelength is introduced via the input fiber optic cable 16 to the input collimating lens element 38 which focuses the divergent bundle of light into a parallel beam of light having a diameter predetermined as a function of the focal length of the collimating lens element and the numerical aperture of the fiber optic cable as well as the index of refraction of the material from which the collimating lens element 18 is constructed. The collimating lens element 38 directs the parallel beam of light through the polarizing element 40 from which this parallel beam of light is directed into and through the Faraday rotator 10 to the polarizing element 44 disposed on the adjacent and lower edge 10b of the Faraday rotator 10. At this point, the beam of light which has been changed in the plane of polarization relative to the beam of light introduced through the first polarizing element 40 is directed through the output collimating lens element 42 through the output fiber optic cable 26 to a logic circuit which can analyze this change in planar orientation of the light beam and derive therefrom the magnitude of current flowing in the energy transmission line 12.

Although the hereinabove embodiment of the invention constitutes a preferred embodiment, modifications can be made thereto without departing from the scope of the invention as detailed in the appended claims. As an example of such a modification, this collimating lens arrangement need not be used exclusively with the Faraday rotator but may in fact be used with other types of optical measuring devices.

I claim:

1. A magneto-optical current measuring device for measuring the current in an energy transmission line, comrising:

a calibrated light source, a magneto-optical current sensing means disposed in surrounding proximity to said energy transmission line for imparting a change in planar orientation of a polarized beam of light as a function of a magnitude of current in said energy transmission line;

a collimating lens element having a spacer lens portion and a collimator segment which has a surface formed in the shape of a paraboloid of revolution, said collimating lens element being receptive of the output of said calibrated light source and further being effective such that said calibrated light source output, which enters said collimating lens element as a divergent beam of light, is focussed by a parabolic surface associated with said paraboloid of revolution into a parallel beam of light; a polarizing element connected between said collimating lens element and said magneto-optical current sensing means and effective such that said parallel beam of light is polarized thereby; logic means connected to said magneto-optical current sensing means for evaluating said change in polar orientation of said polarized beam of light and determining therefrom said magnitude of current.

2. A magneto-optical current measuring device as set forth in claim 1 wherein said magneto-optical current sensing means includes a Faraday rotator and further wherein said Faraday rotator has a collimating lens element and polarizing element disposed on one edge for inputting said polarized beam of light thereto, and a second collimating lens element and polarizing element disposed on an adjacent edge such that said logic means can be connected thereto.

3. A magneto-optical current measuring device as set forth in claim 2 wherein said Faraday rotator, said collimating lens elements, and said polarizing elements are constructed of the same optical material and are secured together in a surface-to-surface manner so as to eliminate any air gaps therebetween.

4. A magneto-optical current device as set forth in claim 1 wherein said collimator segment has said parabolic surface formed at one end and a flat surface formed at the opposite end by a surface of said spacer lens portion, which flat surface extends to the focal length of said parabolic surface.

5. A magneto-optical current measuring device as set forth in claim 2 wherein said Faraday rotator has associated therewith a cross-sectional area of specific dimension and further wherein said parallel beam of light has associated therewith a diameter preselectively established at a dimension substantially less than said cross-sectional dimension of said Faraday rotator.

6. A magneto-optical current measuring device as set forth in claim 1 wherein said collimating lens element and said polarizing element are aligned on said magneto-optical current sensing means by use of a visible wavelength light signal, and further wherein said collimating lens element and said polarizing element are secured to said magneto-optical current sensing means using an ultraviolet wavelength light signal, and further wherein said output of said calibrated light source is a light signal of an infrared wavelength at which wavelength said magneto-optical current sensing means is operative.

* * * * *